(12) United States Patent
Franklin et al.

(10) Patent No.: US 9,786,852 B2
(45) Date of Patent: *Oct. 10, 2017

(54) SEMICONDUCTOR DEVICE WITH BALLISTIC GATE LENGTH STRUCTURE

(71) Applicant: International Business Machines Corporation, Armonk, NY (US)

(72) Inventors: Aaron D. Franklin, Croton on Hudson, NY (US); Shu-Jen Han, Cortlandt Manor, NY (US); Satyavolu S. Papa Rao, Poughkeepsie, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

This patent is subject to a terminal disclaimer.

(21) Appl. No.: 14/956,560

(22) Filed: Dec. 2, 2015

(65) Prior Publication Data
US 2016/0087232 A1    Mar. 24, 2016

Related U.S. Application Data

(63) Continuation of application No. 14/150,275, filed on Jan. 8, 2014, now Pat. No. 9,246,112.

(51) Int. Cl.
*H01L 21/00* (2006.01)
*H01L 21/84* (2006.01)
(Continued)

(52) U.S. Cl.
CPC ...... *H01L 51/0554* (2013.01); *H01L 51/0023* (2013.01); *H01L 51/055* (2013.01);
(Continued)

(58) Field of Classification Search
CPC .......... H01L 29/0673; H01L 29/42356; H01L 29/4236; H01L 29/42376; H01L 29/66045;
(Continued)

(56) References Cited

U.S. PATENT DOCUMENTS 5,311,045 A    5/1994    Baldwin et al.
7,714,386 B2    5/2010    Pesetski et al.
(Continued)

FOREIGN PATENT DOCUMENTS

JP    5157074 B2    3/2013

OTHER PUBLICATIONS

Park, et al., "High-density Integration of Carbon Nanotubes via Chemical Self-assembly", Nature Nanotechnology, vol. 7, Dec. 2012, pp. 787-791.
(Continued)

*Primary Examiner* — Meiya Li
*Assistant Examiner* — Peter M Albrecht
(74) *Attorney, Agent, or Firm* — Isaac J. Gooshaw

(57) ABSTRACT

Embodiments of the invention include a method of fabrication of a semiconductor structure. The method of fabrication includes: Forming a trench in a first dielectric material down to a first conductive material of a bottom gate. A sidewall of the trench contacts a top surface of the first conductive material. Depositing a second conductive material on the sidewall of the trench, which forms an electrical connection with the first conductive material. Depositing a second dielectric material in the trench, and on the second conductive material. Depositing a gate dielectric material on the second conductive material and the dielectric materials. Forming a channel material on the gate dielectric material. Depositing another conductive material on the channel material and portions of the gate dielectric material to form a source terminal and a drain terminal.

16 Claims, 5 Drawing Sheets

(51) Int. Cl.
*H01L 51/05* (2006.01)
*H01L 51/00* (2006.01)

(52) U.S. Cl.
CPC ...... *H01L 51/0545* (2013.01); *H01L 51/0558* (2013.01); *H01L 51/0048* (2013.01)

(58) Field of Classification Search
CPC  H01L 51/0545; H01L 51/055; H01L 51/0554
See application file for complete search history.

(56) References Cited

U.S. PATENT DOCUMENTS

| | | |
|---|---|---|
| 7,772,584 B2 | 8/2010 | Orlowski et al. |
| 7,858,454 B2 | 12/2010 | Kalburge |
| 8,168,495 B1 | 5/2012 | Lim et al. |
| 8,394,664 B2 | 3/2013 | Nicholas et al. |
| 8,963,216 B2 * | 2/2015 | Fife ................... G01N 27/4145 257/253 |
| 9,087,906 B2 * | 7/2015 | Verma ............... H01L 29/78657 |
| 9,246,112 B2 * | 1/2016 | Franklin ............. H01L 51/0554 |
| 2012/0248416 A1 | 10/2012 | Zhou et al. |
| 2012/0261646 A1 | 10/2012 | Zhou et al. |
| 2013/0082242 A1 | 4/2013 | Han et al. |
| 2013/0119348 A1 | 5/2013 | Zhou et al. |
| 2013/0134394 A1 | 5/2013 | Zhou et al. |
| 2015/0069514 A1 | 3/2015 | Shih et al. |

OTHER PUBLICATIONS

U.S. Appl. No. 14/150,275, entitled "Semiconductor Device With Ballistic Gate Length Structure", filed Jan. 8, 2014.

\* cited by examiner

SEMICONDUCTOR DEVICE WITH BALLISTIC GATE LENGTH STRUCTURE

FIELD OF THE INVENTION

The present invention relates generally to the fabrication of semiconductor devices, and more particularly to the fabrication of a carbon nanotube field effect transistor having a ballistic gate length structure.

BACKGROUND OF THE INVENTION

Field effect transistors (FETs) are semiconductor devices that can be fabricated on a bulk semiconductor substrate or on a silicon-on-insulator (SOI) substrate. FET devices generally consist of a source terminal, a drain terminal, a gate terminal, and a channel between the source and drain. The gate terminal is separated from the channel by a thin insulating layer, typically of silicon oxide, called the gate oxide or gate dielectric. An applied potential at the gate modulates the conductivity of the channel between the source and drain thereby controlling the current flow between the source and the drain.

Structural elements of FET devices create parasitic capacitance that can limit the speed of high-frequency applications. Capacitance is the ability to store an electric charge, and parasitic capacitance is common inside electronic devices whenever two conductors are parallel to each other. Capacitance decreases with increased distance between two parallel conductors, usually separated by an insulator or dielectric material. Capacitance also decreases with decreased surface area of the parallel conductors involved, or with a decrease in the dielectric constant of the material between the conductors. Proper device design is, therefore, important to minimize the overall parasitic capacitance of FETs.

SUMMARY

Embodiments of the invention include a method of fabrication for a semiconductor structure. The method of fabrication includes: Forming a trench in a first dielectric material down to a first conductive material of a bottom gate. A sidewall of the trench contacts a top surface of the first conductive material. Depositing a second conductive material on the sidewall of the trench to form an electrical connection between the first conductive material and the second conductive material. Depositing a second dielectric material in the trench and on the second conductive material. Depositing a gate dielectric material on the i) second conductive material, ii) the first dielectric material, and iii) the second dielectric material. Forming a channel material on the gate dielectric material. Depositing a third conductive material on the channel material and portions of the gate dielectric material to form a source terminal and a drain terminal.

DETAILED DESCRIPTION

Figure 1:
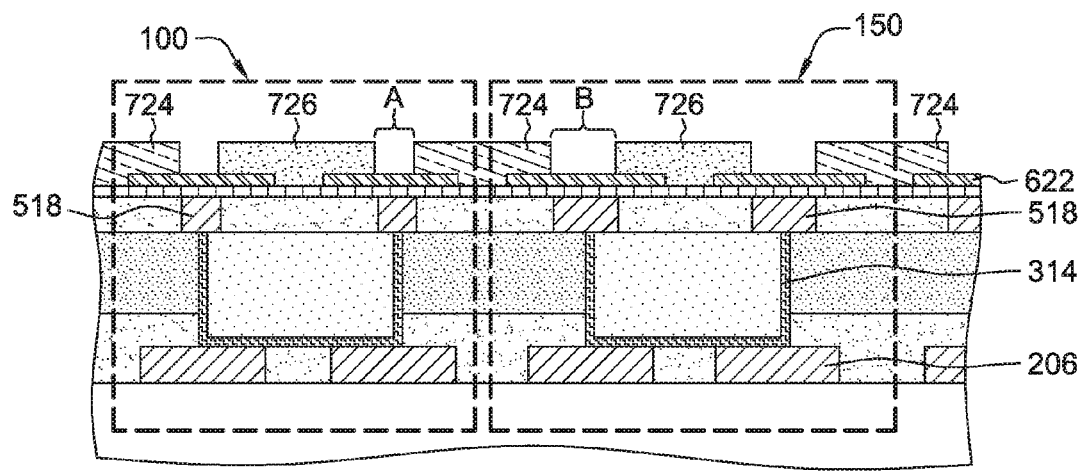
FIG. 1 illustrates a cross-sectional view of a semiconductor device, in accordance with an embodiment of the present invention.

Semiconductor devices such as carbon nanotube field-effect transistors (CNTFETs) offer the potential to deliver superior performance in high-speed digital electronics and in radio-frequency (RF) applications. In a transistor device, a significant number of electrons may be lost due to scatter from collisions. The mean free path is the average distance travelled by an electron between collisions which modify its direction, or energy or other particle properties. Ballistic transport refers to electron transport through a short conductive path less than the mean free path during which the electrons do not scatter in the time it takes to travel the path.

Carbon nanotubes have physical properties which provide for highly linear electron conduction approaching ballistic transport at a larger mean free path than other semiconductors. Electron conduction without scatter means high current density may be delivered, reducing gate resistance. Embodiments of the present invention define a carbon nanotube field-effect transistor (CNTFET) structure with an embedded inverted T-shape having narrow gate lengths within thick dielectric layers connected to a larger buried bottom gate, which reduce both parasitic capacitance and gate resistance while optimizing the cutoff frequency of the device.

An embedded T-shaped gate terminal has the form of an inverted T with a bottom gate portion representing the horizontal part of the T, and a vertical conductor portion of the gate representing the vertical part of the T. To build a T-gate transistor with reduced parasitic capacitance requires that the depth of dielectric, which is equal to the height of the vertical portion of the gate, remain at a thickness of about 300 nm. To build a T-gate transistor with a ballistic gate length using this approach, i.e., sub 50 nm width for a carbon nanotube, typically requires etching a very narrow but deep trench with an aspect ratio of 6:1, and filling the deep trench with a conductor. Process capability for filling trenches with an aspect ratio greater than 3:1 (depth to width) without leaving voids in the conductor is not currently available. Embodiments of the present invention form two embedded T-gates at the same time allowing the gate length to be deposition controlled, to nm precision, instead of aspect ratio limited. Fabrication methods are disclosed for forming embedded T-gate transistors using sidewall transfer and planarization methods. Incorporating carbon nanotube channels over a sub 50 nm length gate within the embedded T-gate transistors supports ballistic transport of electrons. Reduced parasitic capacitance and reduced gate resistance through high aspect ratio trenches with near ballistic transport of electrons offer the potential to deliver superior performance for radio frequency (RF) applications in high-speed electronic devices.

Embodiments of the present invention generally provide a CNTFET device with nanometer-controlled precision gate terminal lengths of 50 nm or less, permitting reproducible and manufacturable access to the ballistic transport regime. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the Figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "on", "over", "overlying", "atop", "positioned on", or "positioned atop" mean that a first element, such as a first structure, is present on a second element, such as a second structure, wherein intervening elements, such as an interface structure may be present between the first element and the second element. The terms "direct contact", "directly on", or "directly over" mean that a first element, such as a first structure, and a second element, such as a second structure, are connected without any intermediary conducting, insulating or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Structure

Referring now to the Figures, FIG. 1 illustrates a cross-sectional view of a semiconductor device, in accordance with an embodiment of the present invention. CNTFET 100 includes at least source terminals 724, drain terminals 726, carbon nanotubes in channel layer 622, and two embedded "T" gates, per device, comprised of conductive material 206, metal liner 314, and conductive material 518. CNTFET 150 includes the same components as CNTFET 100 except for a different gate length in conductive material 518. The gate length refers to the width as shown in the cross section view of FIG. 1. CNTFET 100 has a gate length of width A, and CNTFET 150 has a gate length of width B. In FIG. 1, width A is smaller than width B.

Method

Figure 2A:
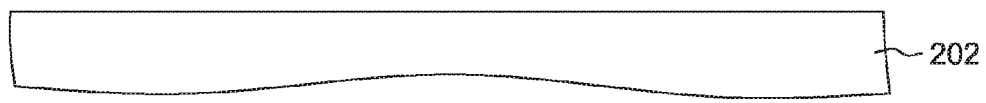
FIG. 2A is a cross-sectional view of a semiconductor substrate upon which the semiconductor device of FIG. 1 may be fabricated, in accordance with embodiments of the present invention.

FIGS. 2A-7 describe an embodiment for fabricating CNTFET 100 and CNTFET 150. FIG. 2A is a cross-sectional view of a semiconductor substrate upon which the semiconductor device of FIG. 1 may be fabricated, in accordance with embodiments of the present invention. Substrate 202 may include a semiconductor substrate, e.g., silicon, GaAs, silicon-on-insulator (SOI), or may include lower level metal layers in interlevel dielectric materials. Substrate 202 may include an electrically semiconducting material, an insulating material, a conductive material, devices, or structures made of these materials or any combination thereof (e.g., a lower level of an interconnect structure). In certain embodiments, substrate 202 is comprised of a semiconducting material, such as Si, SiGe, SiGeC, SiC, Ge alloys, GaAs, InAs, InP, and other IIIN or II/VI compound semiconductors, or organic semiconductors. In addition to the above listed semiconducting materials, substrate 202 may also be a layered semiconductor, such as, for example, Si/SiGe, Si/SiC, SOIs, or silicon germanium-on-insulators (SGOIs). These semiconductor materials may form a device, devices, or structures, which may be discrete or interconnected.

In certain embodiments, substrate 202 includes one or more semiconductor devices, such as complementary metal oxide semiconductor (CMOS) devices or other field effect transistors (FETs), strained silicon devices, carbon-based (carbon nanotubes and/or graphene) devices, phase-change memory devices, magnetic memory devices, magnetic spin switching devices, single electron transistors, quantum devices, molecule-based switches, and other switching or memory devices that can be part of an integrated circuit formed therein. In other embodiments, substrate 202 includes an electrical insulating material, such as an organic insulator, an inorganic insulator, or a combination thereof. Substrate 202 can include electrically conducting material, for example, polysilicon, an elemental metal, an alloy including at least one elemental metal, a metal silicide, a metal nitride, etc., or combinations thereof including multilayers.

Figure 2B:
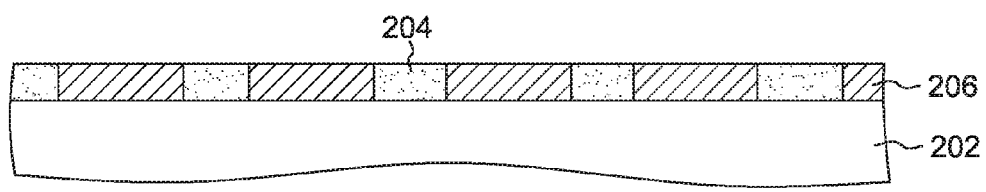
FIG. 2B depicts fabrication steps, in accordance with an embodiment of the present invention.

FIG. 2B depicts fabrication steps, in accordance with an embodiment of the present invention. Dielectric layer 204 may be formed on substrate 202 using an appropriate deposition technique, such as physical vapor deposition (PVD), plasma assisted chemical vapor deposition (PACVD), chemical vapor deposition (CVD), plasma enhanced chemical vapor deposition (PECVD), low pressure chemical vapor deposition (LPCVD), atomic layer deposition (ALD), chemical solution deposition (such as spin coating), or evaporation. Dielectric layer 204 may comprise dielectric material including, but not limited to: SiC, SiN, $SiO_2$, a carbon doped oxide, a nitrogen and hydrogen doped silicon carbide SiC(N,H), low-K dielectrics, or multilayers thereof. Dielectric layer 204 properties, such as material and thickness, are selected to provide reduced parasitic capacitance with nearby conductive structures. In various embodiments, dielectric layer 204 is SiN with a typical thickness of about 500 nm to about 1000 nm. A person of ordinary skill in the art will recognize that chemical-mechanical planarization (CMP) steps may be inserted after the dielectric deposition process to planarize the surface of dielectric layer 204. CMP may use a combination of chemical etching and mechanical polishing to smooth the surface and even out any irregular topography.

Damascene patterning is a process of forming trenches, filling the trenches with a conductive material, such as plated or CVD Cu, and removing excess conductive material through planarization. In one embodiment using an etch mask, dielectric layer 204 is etched down to substrate 202 forming more than one trench therein. The trenches are preferably formed by employing a reactive ion etch (RIE) or similar process. RIE uses chemically reactive plasma, generated by an electromagnetic field, to remove various materials. A person of ordinary skill in the art will recognize that the type of plasma used will depend on the material being removed, or that other etch processes, e.g., wet chemical etch, laser ablation, etc., may be used. In other embodiments, depending on the underlying layers within substrate 202, a portion of dielectric layer 204 may remain in the trenches wherein the remaining thickness is determined by the design requirements of the device.

Conductive material 206 is deposited within the trenches formed in dielectric layer 204, and over the surface of dielectric layer 204. Conductive material 206 may be comprised of one or more of Cu, Al, W, Ti, doped polysilicon, or any other useful conductive material or alloy(s). Conductive material 206 is deposited using an appropriate deposition technique, such as sputter deposition, electrochemical deposition (ED), electroplating, CVD, ALD, or other deposition techniques. The deposition may be followed by a CMP process to remove excess conductive material from the surface of dielectric layer 204 and to confine conductive material 206 to the trenches formed in dielectric layer 204. In various embodiments, conductive material 206 is plated Cu which may require an initial seed or catalyst layer deposited prior to plating. Conductive material 206 forms the bottom gate, or the horizontal portion of an inverted T-shaped gate terminal structure.

Figure 2C:
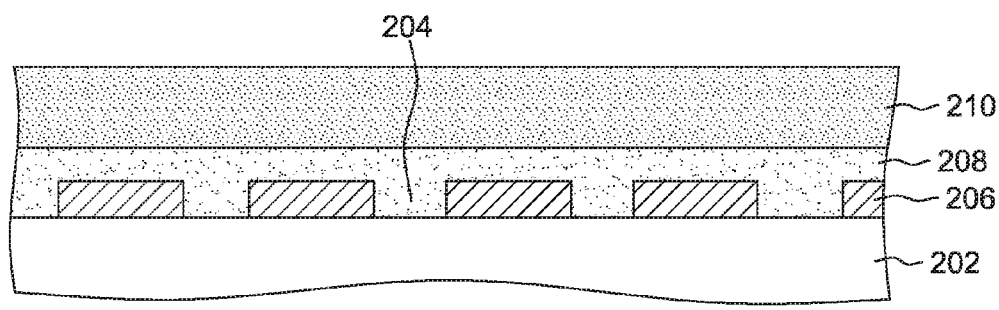
FIG. 2C depicts additional fabrication steps, in accordance with an embodiment of the present invention.

FIG. 2C depicts additional fabrication steps, in accordance with an embodiment of the present invention. Dielectric layer 208 may be deposited on conductive material 206 and on dielectric layer 204 outside the trenches using an appropriate deposition technique (discussed above). Dielectric layer 208 may include SiC, SiN, $SiO_2$, a carbon doped oxide, a nitrogen and hydrogen doped silicon carbide SiC(N,H), or multilayers thereof. CMP steps may be performed to planarize the surface. In various embodiments, dielectric layer 208 is SiN with a typical thickness of about 50 nm to about 200 nm.

Dielectric layer 210 is deposited on dielectric layer 208 utilizing an appropriate deposition technique (discussed above). Dielectric layer 210 may include SiC, SiN, $SiO_2$, a carbon doped oxide, a nitrogen and hydrogen doped silicon carbide SiC(N,H), or any combination thereof. Dielectric layers 208 and 210 may or may not be the same material. The use of different dielectric materials and dielectric thicknesses permits further reduction in capacitance and optimizes a balance between resistance reduction in a gate structure and parasitic capacitance with conductive or semiconductive structures and the gate structure. The combined thickness for dielectric layers 208 and 210 may be from a few hundred nanometers to several micrometers. In various embodiments, dielectric layer 210 is $SiO_2$ with a typical thickness of about 100 nm to about 500 nm.

Figure 3A:
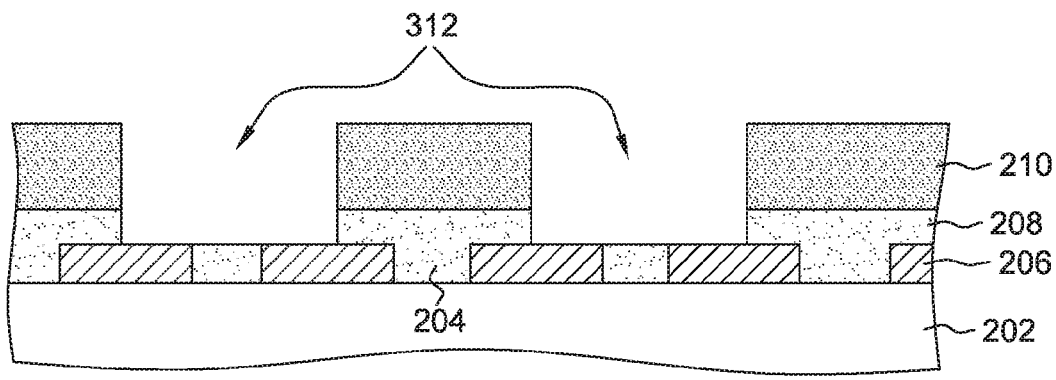
FIG. 3A depicts additional fabrication steps, in accordance with an embodiment of the present invention.

FIG. 3A depicts additional fabrication steps, in accordance with an embodiment of the present invention. Using a conventional lithography process (not shown), dielectric layers 208 and 210 are etched to form more than one trench therein, i.e., trenches 312. Trenches 312 can be formed using an appropriate etch technique, such as RIE, or a similar process. Dielectric layers 208 and 210 should be removed down to conductive material 206 and dielectric layer 204. In an alternate embodiment, conductive material 206 may be large enough to form a plurality of trenches over a single section of conductive material 206 (not shown).

Figure 3B:
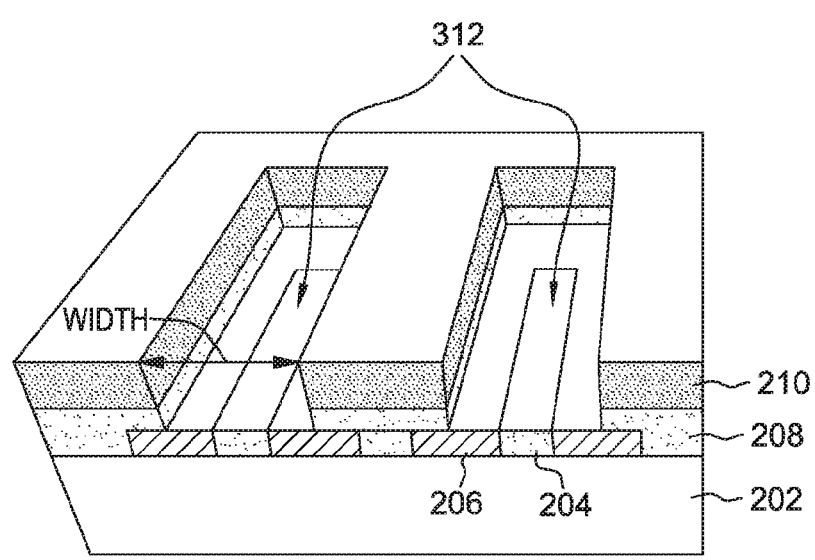
FIG. 3B depicts a perspective view of the trenches formed in FIG. 3A, in accordance with an embodiment of the present invention.

FIG. 3B depicts a perspective view of the trenches formed in FIG. 3A, in accordance with an embodiment of the present invention. In embodiments of the present invention, each trench, of trenches 312, contains two bottom gates formed of conductive material 206 at the bottom of one large rectangular trench. Extending underneath beyond the edges of the one large trench, each bottom gate of conductive material 206 is centered at an edge of the trench. The registration of each large trench over the two associated bottom gates of conductive material 206 are well within process capabilities of current mask and etch processes. In an embodiment of the present invention, multiple trenches may form multiple bottom gate terminals which are cascaded or connected in series or parallel within a single semiconductor device.

Figure 3C:
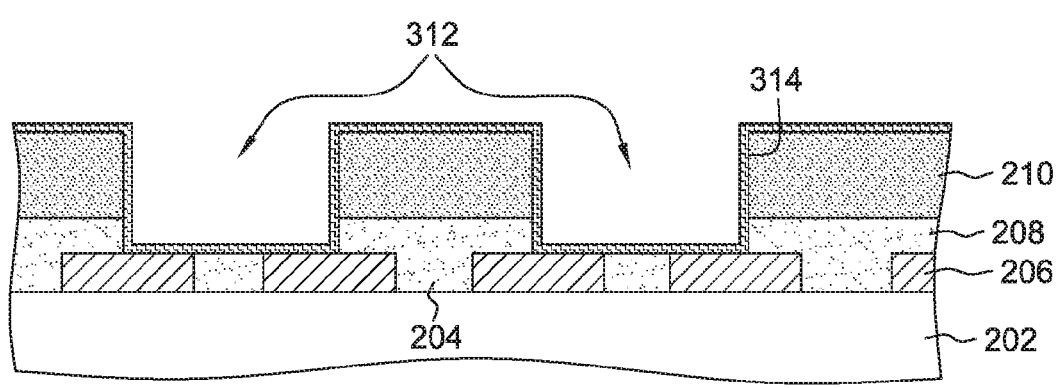
FIG. 3C depicts additional fabrication steps, in accordance with an embodiment of the present invention.

FIG. 3C depicts additional fabrication steps, in accordance with an embodiment of the present invention. Metal liner 314 may be formed over the sidewalls and bottom of trenches 312, as well as the surface of dielectric layer 210 using CVD, or other appropriate deposition techniques (discussed above). Metal liner 314 may include Cu, Al, Ta, W, Ti, doped polysilicon, alloys, or any other useful conductive material or combinations thereof, such as a TaN liner with Cu plated on the TaN. Metal liner 314 and conductive material 206 may or may not be the same material. Conductive material 206 and metal liner 314 are chosen to minimize electrical resistance between them. In various embodiments, metal liner 314 is Ta with a typical thickness of about 5 nm to about 50 nm. In embodiments of the present invention, the thickness of metal liner 314 defines the gate length of resulting CNTFET structures, such that the gate length is deposition-controlled instead of aspect ratio limited. Metal liner 314 forms the vertical portion of an inverted T-shaped structure, having an electrical connection with conductive material 206.

Conductive material 206 and the vertical portion of metal liner 314 formed an inverted "T" shape that will be employed as an embedded gate terminal structure. It should be understood that other shapes may be employed, such as, an "L" shape, a rectangular shape, a U or inverted U-shape, etc. In certain embodiments, conductive material 206 extends laterally beyond the boundaries of metal liner 314 in at least one direction. In other embodiments, a single-sheet bottom-gate structure (e.g., conductive material 206 being a sheet) offers the minimum resistance possible for a given device size.

Figure 4A:
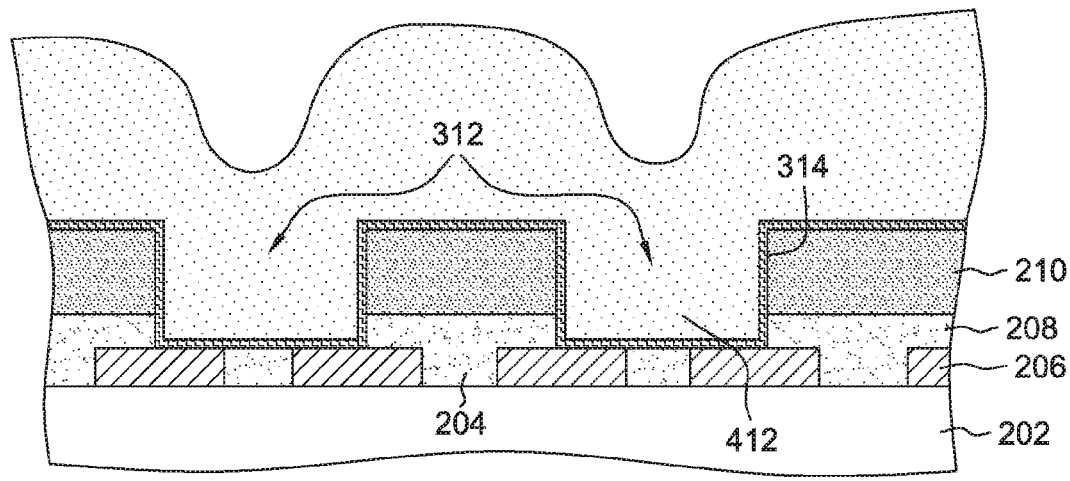
FIG. 4A depicts additional fabrication steps, in accordance with an embodiment of the present invention.

FIG. 4A depicts additional fabrication steps, in accordance with an embodiment of the present invention. Dielectric layer 412 is formed on metal liner 314 using an appropriate deposition technique (discussed above) to fill trenches 312. Dielectric layer 412 may comprise a dielectric material, such as $SiO_2$, or a low-K variant of $SiO_2$. Dielectric layer 412 may be deposited as a conformal layer.

Figure 4B:
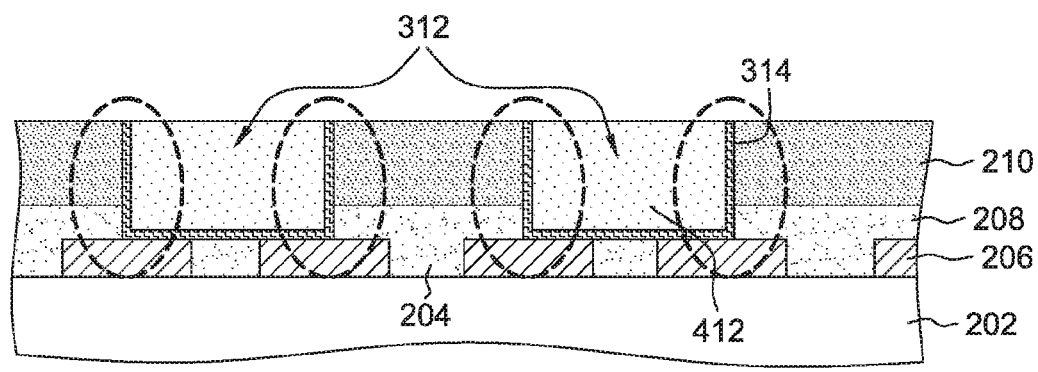
FIG. 4B depicts additional fabrication steps, in accordance with an embodiment of the present invention.

FIG. 4B depicts additional fabrication steps, in accordance with an embodiment of the present invention. A CMP process follows the deposition of dielectric layer 412 to remove dielectric layer 412 above the top of each trench of trenches 312 and to planarize the surface. CMP may be used to remove excess metal liner 314, which resides directly over dielectric material 210 between trenches 312. Two electrically connected embedded T-gate structures are formed within each trench of trenches 312, and are circled in FIG. 4B. The remaining portion of metal liner 314 on the sidewall of each trench forms the vertical part of embedded T-gate structures. A portion of metal liner 314 is coupled with a portion (as depicted) of conductive material 206, which forms the horizontal part of the embedded T-gate structure.

Figure 4C:
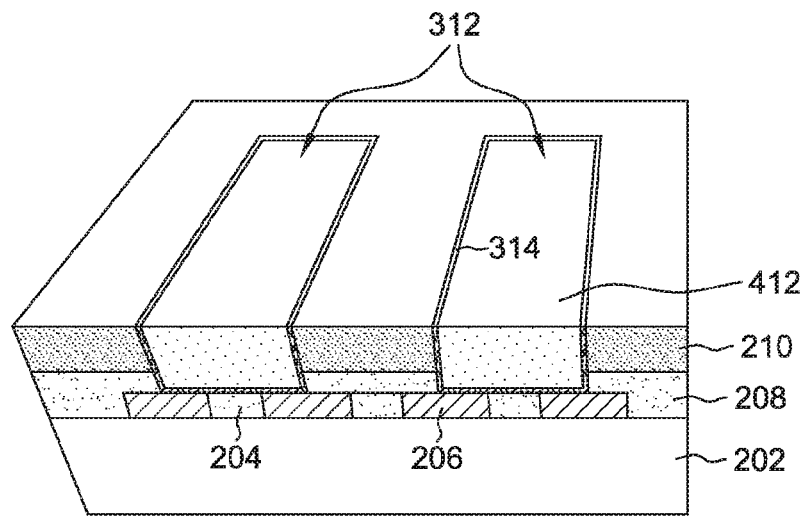
FIG. 4C depicts a perspective view of the planarized surface of FIG. 4B, in accordance with an embodiment of the present invention.

FIG. 4C depicts an exemplary perspective view of the planarized surface of FIG. 4B, in accordance with an embodiment of the present invention. Metal liner 314 connects at the end of each trench of trenches 312 through the trench sidewalls which are now covered with dielectric layer 412. The connection visible on the planarized top surface shown in FIG. 4C is a unique structural signature identifying the fabrication method used for making the structure of CNTFET 100 and CNTFET 150. The rectangular trench with two bottom or finger gates of conductive material 206 at the bottom of each trench of trenches 312 is a structural signature of the fabrication method of an embodiment of the present invention. The portion of metal liner 314 connecting the two associated finger gates of conductive material 206 at the bottom of each trench of trenches 312 is another structural signature of the fabrication method.

Figure 5:
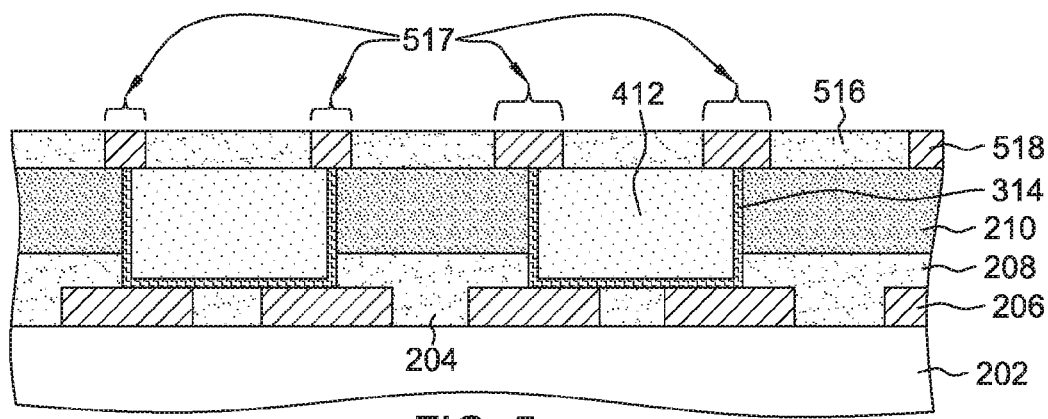
FIG. 5 depicts additional fabrication steps, in accordance with an embodiment of the present invention.

FIG. 5 depicts additional fabrication steps, in accordance with an embodiment of the present invention. In one embodiment, dielectric layer 516 is deposited on metal liner 314, dielectric layer 412, and dielectric layer 210 using an appropriate deposition technique (discussed above). In certain embodiments, dielectric layer 516 includes dielectric material, such as SiN. Dielectric layer 516 may have a typical thickness of about 20 nm to about 150 nm. Increasing thickness of dielectric layer 516 may help reduce source-to-gate capacitance.

Damascene processing may be utilized at this stage to form trenches 517 of various gate lengths in dielectric layer 516, such that the aspect ratio of trenches 517 are not greater than 3:1 (depth to width). Using a conventional lithography process (not shown), dielectric layer 516 is etched forming trenches 517. Trenches 517 can be formed by a reactive ion etch (RIE) or similar process. Dielectric layer 516 must be fully removed from the top of metal liner 314.

Conductive material 518 is deposited into trenches 517 formed in dielectric layer 516. Conductive material 518 may include Cu, Al, W, Ti, doped polysilicon, or any other useful conductive material or alloys. Conductive material 518 may be deposited using PVD or other deposition techniques. The aspect ratio of trenches 517 in dielectric layer 516 is within the capability of a PVD process. In various embodiments, conductive material 518 is Cu. In the case of plated Cu, an initial seed or catalyst layer may be deposited prior to plating. The deposition may be followed by a CMP process to remove excess conductive material 518 and to confine conductive material 518 to trenches 517 formed in dielectric layer 516.

The additional fabrication steps of FIG. 5 provide a method for producing top gates of variable lengths. The width of the vertical portion of metal liner 314 is the same in all trenches of trenches 517 because it is deposition controlled based on the thickness of metal liner 314. If this vertical portion of metal liner 314 were used without dielectric layer 516 and conductive material 518, as shown later in FIG. 8, the gate lengths across a wafer would all be the same. In order to have varying gate lengths within the same layer across a wafer, the above damascene process could be used with various gate length openings created in the etch mask. Typical gate lengths may be about 40 nm to about 100 nm defined, for example, with electron-beam lithography.

Figure 6:
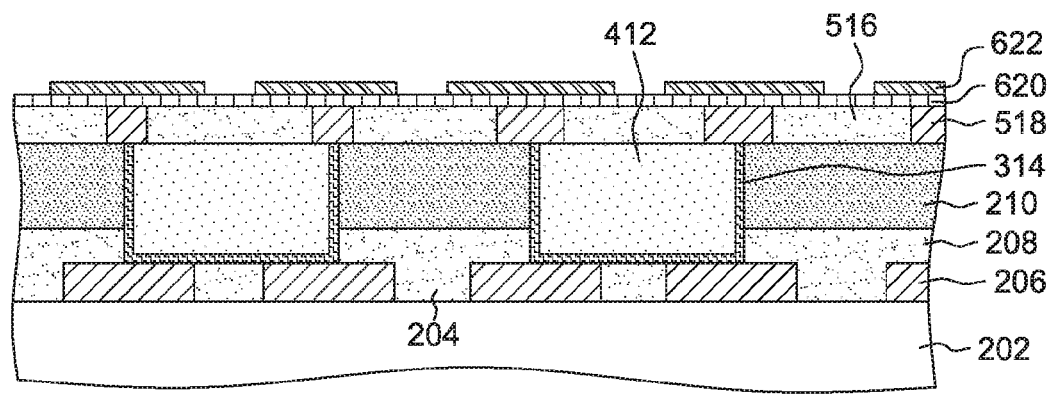
FIG. 6 depicts additional fabrication steps, in accordance with an embodiment of the present invention.

FIG. 6 depicts additional fabrication steps, in accordance with an embodiment of the present invention. Gate dielectric layer 620 may be deposited on conductive material 518 and dielectric layer 516 using ALD, or other appropriate deposition technique (discussed above). Gate dielectric layer 620 may include $HfSiO_4$, $ZrSiO_4$, $SiO_2$, $Al_2O_3$, $HfO_2$, or $ZrO_2$. In certain embodiments, gate dielectric layer 620 may comprise a dielectric material, such as $HfO_2$, with a thickness of about 5 nm to about 50 nm.

Channel layer 622 is formed on gate dielectric layer 620. In certain embodiments, channel layer 622 is a conductive carbon material formed as a dense array of aligned single-walled semiconducting carbon nanotubes set in trenches to provide a consistent pitch between each nanotube. A person of ordinary skill in the art will recognize carbon nanotubes can be produced in solution, and then purified with known solution-based separation techniques to remove the non-conducting nanotubes. In certain embodiments, 5-10 nm of $SiO_2$ is deposited over the $HfO_2$ of gate dielectric layer 620 using CVD and a lift-off process to form a trench pattern. A specialized molecule, such as 4-(N-hydroxycarboxamido)-1-methylpyridinium iodide (NMPI), which contains a hydroxamic acid end group, is deposited and selectively self-assembles on the $HfO_2$, but not on the $SiO_2$ of the gate dielectric surface. The specialized molecule attracts the carbon nanotubes to the $HfO_2$ trenches, and an electrostatic interaction with surfactant-wrapped carbon nanotubes leads to placement of the carbon nanotubes with appropriate density. One skilled in the art will recognize that additional cleaning processes may be necessary before creating source and drain terminals over the top of the carbon nanotubes.

In alternate embodiments, channel layer 622 may be a conductive carbon material such as transferred graphene material, i.e., a single planar sheet of carbon atoms, fabricated by known methods including, but not limited to, chemical vapor deposition (CVD), an epitaxially grown layer, a solution based deposited layer (dipping), or a mechanically exfoliated layer. The graphene material may be formed with between about 1 to about 4 graphene layers, although a single layer of graphene is preferred.

In alternate embodiments, channel layer 622 may be formed of a semiconductor material other than a conductive carbon, such as silicon, which allows for fabrication of narrow gate lengths, sub 50 nm, using the methods of the present invention. Narrow gate lengths offer an electrical performance advantage to materials other than carbon nanotubes or graphene.

Figure 7:
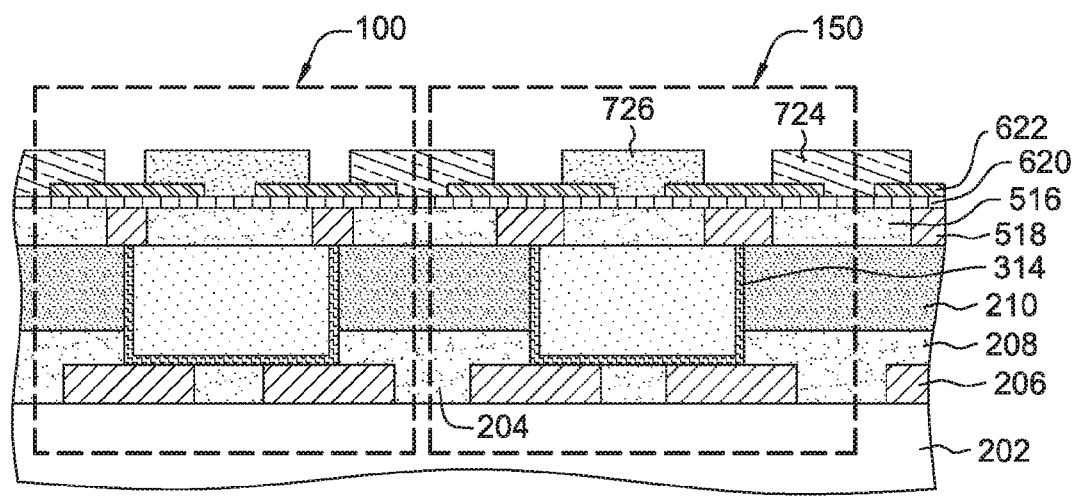
FIG. 7 depicts additional fabrication steps, in accordance with an embodiment of the present invention.

FIG. 7 depicts additional fabrication steps, in accordance with an embodiment of the present invention. Source terminals 724 and drain terminals 726 are formed for a source (S) and a drain (D), respectively, of CNTFET 100 and CNTFET 150. Source terminals 724 and drain terminals 726 can be formed of a highly conductive material which may include: Cu, Al, Pd, W, Ti, doped polysilicon, highly doped semiconductor materials, or any other useful conductive material or alloys/combinations thereof. In certain embodiments, source terminals 724 and drain terminals 726 are deposited on channel layer 622 and gate dielectric layer 620 using CVD or other appropriate deposition process (discussed above) followed by lithography and etching processes, or a lift-off process to remove any excess terminal materials from channel layer 622. Source terminals 724 and drain terminals 726 are formed such that source terminals 724 and drain terminals 726 are in electrical connection with channel layer 622. In various embodiments, source terminals 724 and drain terminals 726 are Pd with a typical thickness of about 10 nm to about 50 nm. In some embodiments, a passivation layer, a dielectric capping layer, or a protective coating, such as SiN or $SiO_2$, may be deposited on source terminals 724 and drain terminals 726 to protect the transistor surface from environmental conditions.

In CNTFET 100 and CNTFET 150, the carbon nanotubes of channel layer 622 extend underneath source terminals 724 and drain terminals 726. In an embodiment, the width of the portion of channel layer 622 underneath one source terminal 724 and one drain terminal 726 is made wider than the width of the top portion of the gate terminal formed in conductive material 518 to allow for variability in registration. In an alternate embodiment, multiple gates are formed into one electrically connected row or cascade, and within the row, channel layer 622 may extend under all source terminals 724 and drain terminals 726 as one continuous sheet or many continuous channels.

In other embodiments, fabrication steps may further include annealing conductive materials. The annealing may include heat treatments of the semiconductor structure in air or controlled gas environments.

Structure

Figure 8:
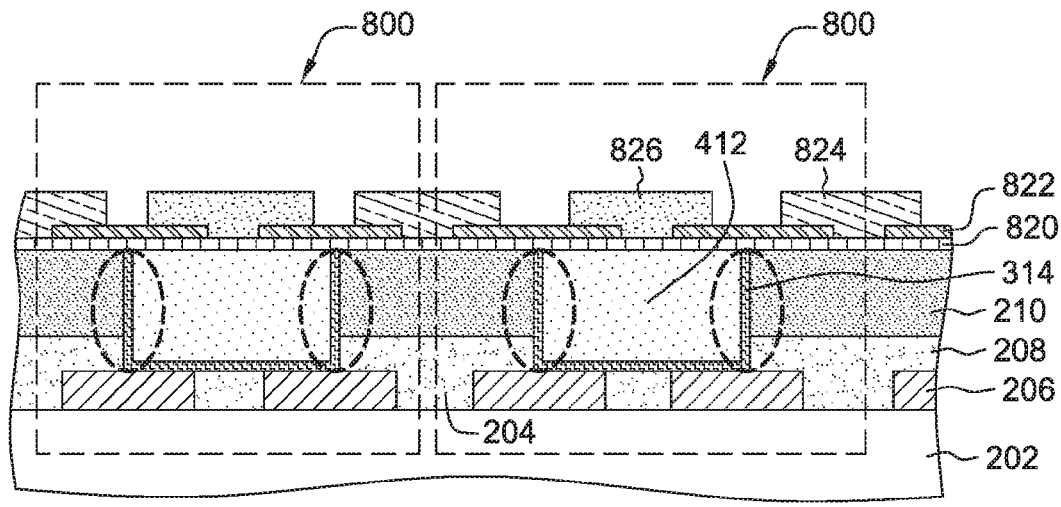
FIG. 8 depicts additional fabrication steps, in accordance with an alternate embodiment of the present invention.

FIG. 8 depicts additional fabrication steps, in accordance with an alternate embodiment of the present invention. In an alternate embodiment, gate dielectric layer 820 may be deposited on metal liner 314, dielectric layer 412, and dielectric layer 210 in the same fashion as gate dielectric layer 620 is deposited on conductive material 518, and dielectric layer 516. Channel layer 822 may formed on gate dielectric layer 820 in the same fashion as channel layer 622 is formed on gate dielectric layer 620. Source terminals 824 and drain terminals 826 may be formed on channel layer 822 and gate dielectric layer 820 in the same fashion as source terminals 724 and drain terminals 726 are deposited on channel layer 622 and gate dielectric layer 620. In the alternate embodiment, the widths of the circled portions of metal liner 314 are uniform and/or controlled by metal liner 314 deposition. The width of the circled portions of metal liner 314 corresponds to the gate length of CNTFET 800. During fabrication of CNTFET 800, the gate lengths across a wafer may all be the same. If the design requirements allow the same gate length to be used across a wafer, the processing steps forming conductive material 518 and dielectric layer 516 of FIG. 5 may be eliminated to save cost and production time.

Figure 9:
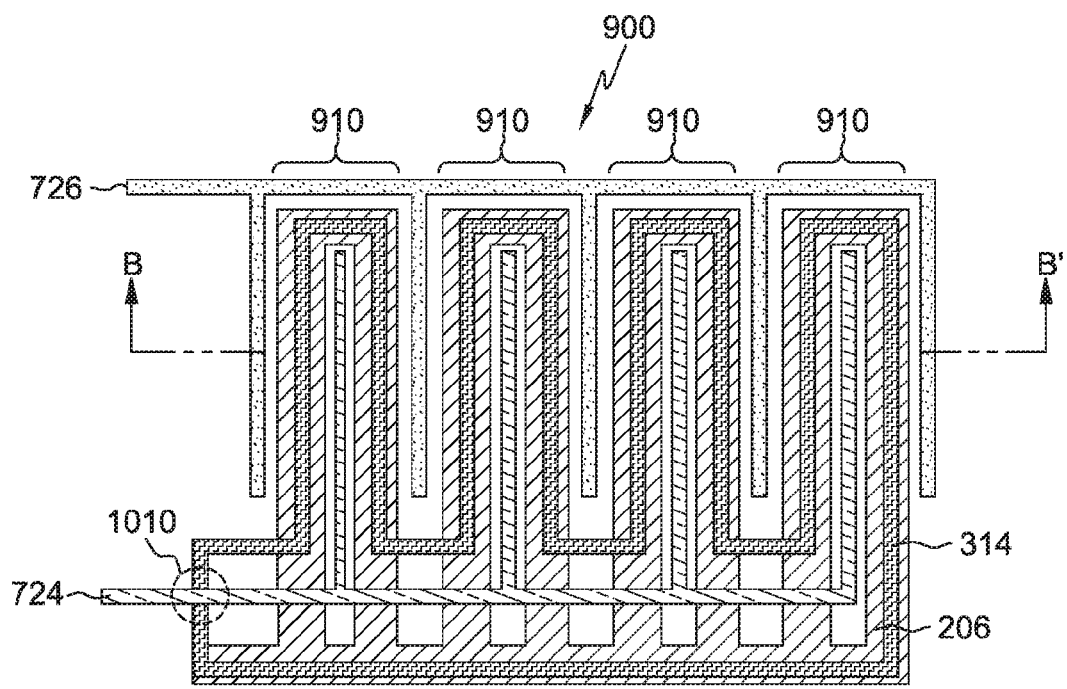
FIG. 9 illustrates a top-down view of a semiconductor device with multiple embedded CNTFET gates, in accordance with an embodiment of the present invention.

FIG. 9 illustrates a top-down view of a semiconductor device with multiple embedded gate terminals, such as CNTFET 100, in accordance with an embodiment of the present invention. In the illustrative embodiment, gate structure 900 is formed such that the number of times source terminals 724 cross over metal liner 314 are minimized to reduce source-to-gate capacitance. Metal liner 314 may be formed around source terminals 724 and drain terminals 726 to, for example, minimize cross-over points to reduce source-to-gate capacitance. Gate structure 900 includes overlap 1010, which is a source-to-gate overlap, whereas without minimizing overlaps, gate structure 900 would have up to four overlaps thereby increasing the overall capacitance and reducing the performance of gate structure 900. In the present embodiment, the device requirements must allow for an interconnected cascading gate structure. Gate structure 900 may be formed by etching four trenches, shown as trenches 910, prior to deposition of metal liner 314. FIG. 9 depicts bottom gates formed of conductive material 206 as a point of reference. The line B-B' indicates where the semiconductor devices are cross-sectioned for views depicted in FIGS. 1 through 8.

Having described embodiments for transistor devices and methods of fabrication of an embedded T-gate structure CNTFET device having reduced parasitic capacitance and a ballistic gate length (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the fabrication steps depicted above may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed:

1. A method of fabricating a semiconductor structure, the method comprising:
   forming a trench in a first dielectric material down to a first conductive material of a bottom gate, wherein a sidewall of the trench contacts a top surface of the first conductive material;
   depositing a second conductive material on the sidewall of the trench to form an electrical connection between the first conductive material and the second conductive material;
   depositing a second dielectric material in the trench and on the second conductive material;
   depositing a gate dielectric material on i) the second conductive material, ii) the first dielectric material, and iii) the second dielectric material;
   forming a channel material on the gate dielectric material; and depositing a third conductive material on the channel material and portions of the gate dielectric material to form a source terminal and a drain terminal.

2. The method of claim 1, the method further comprising:
depositing a third dielectric material on a substrate;
forming a first opening in the third dielectric material;
forming the bottom gate by filling the first opening in the third dielectric material with the first conductive material; and
depositing the first dielectric material on the third dielectric material and the first conductive material.

3. The method of claim 2, the method further comprising:
removing an excess portion of the second dielectric material and an excess portion of the second conductive material not in the trench.

4. The method of claim 1, wherein depositing the gate dielectric material on the second conductive material, the first dielectric material, and the second dielectric material further comprises:
depositing a fourth dielectric material on i) the second conductive material, ii) the first dielectric material, and iii) the second dielectric material;
forming a second opening in the fourth dielectric material down to the second conductive material;
depositing a fourth conductive material in the second opening and over a surface of the fourth dielectric material; and
depositing the gate dielectric material on the fourth conductive material and the fourth dielectric material.

5. The method of claim 4, the method further comprising:
removing an excess portion of the fourth conductive material not in the second opening.

6. The method of claim 1, wherein forming the channel material on the gate dielectric material further comprises:
depositing carbon nanotubes on the gate dielectric material; and
patterning the carbon nanotubes of the channel material.

7. The method of claim 1, wherein the channel material includes one or more of: a conductive carbon material, a patterned layer of carbon nanotubes, a continuous layer of carbon nanotubes, a graphene material, and a semiconductor material.

8. The method of claim 1, wherein a thickness of the first dielectric material is configured based, at least in part, on a predicted capacitance between the source terminal and the bottom gate.

9. The method of claim 1, wherein the first dielectric material comprises one or more constituent dielectric materials chosen based, at least in part, on a predicted capacitance between the source terminal and the bottom gate.

10. The method of claim 1, wherein the semiconductor structure is a carbon nanotube field effect transistor having an embedded inverted T-shaped gate.

11. The method of claim 1, further comprising a ratio of a depth to a width of the second conductive material that is greater than 3:1.

12. The method of claim 1, wherein the second conductive material includes one or more of: Ta, TaN, Cu, W, Al, and Ti.

13. The method of claim 1, wherein the second dielectric material includes one or both of: $SiO_2$ and a low-K variant of $SiO_2$.

14. The method of claim 1, wherein a thickness of the second conductive material formed on the sidewall of the trench is deposition controlled and defines a gate length of a transistor.

15. The method of claim 14, wherein the gate length of the transistor provides ballistic transport of charge carriers through a conductive carbon material of the channel material.

16. The method of claim 14, wherein the gate length of the transistor is 50 nm or less.

* * * * *